US007593696B2

(12) United States Patent
Fischer

(10) Patent No.: US 7,593,696 B2
(45) Date of Patent: Sep. 22, 2009

(54) TUNABLE RADIO FREQUENCY FILTER

(75) Inventor: Georg Fischer, Nuremberg (DE)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 421 days.

(21) Appl. No.: 11/055,137

(22) Filed: Feb. 10, 2005

(65) Prior Publication Data

US 2006/0178114 A1 Aug. 10, 2006

(51) Int. Cl.
*H04B 1/40* (2006.01)
(52) U.S. Cl. .......................................... 455/87; 455/73
(58) Field of Classification Search ............... 333/174; 455/87
See application file for complete search history.

(56) References Cited

U.S. PATENT DOCUMENTS

| 2,196,881 | A | | 1/1940 | Wheeler | |
|---|---|---|---|---|---|
| 7,003,275 | B1 | * | 2/2006 | Petrovic | ...................... 455/323 |
| 2004/0130414 | A1 | * | 7/2004 | Marquardt et al. | .......... 333/174 |
| 2006/0066422 | A1 | * | 3/2006 | Itoh et al. | ................... 333/219 |

OTHER PUBLICATIONS

European Search Report dated May 19, 2006 for Application No. 06250538.3-2215.
"Handbook of Practical Electronic Circuits (Chapter 5: Filter, Attenuator, and Waveforming Circuits)" 1982 Prentice Hall, Inc., Lenk, J.D.
"RF Microelectronics (Chapter 4: Multiple Access Techniques and Wireless Standards)" 1998, Prentice Hall Ptr.
C. Calos et al., "Microwave Circuits Based on Negative Refractive Index Material Structures," 33 European Microwave Week, Munich 2003.
C. Caloz et al., "Transmission Line Approach of Left Handed Materials and Microstrip Implementation on an Artificial LH Transmission Line," IEEE Transactions On Antennas And Propagation, vol. 52, No. 5, May 2004.
A. Lai et al., "Composite Right/Left-Handed Transmission Line Metamaterials," IEEE Microwave Magazine, Sep. 2004.
C. Calos et al., "Unusual Propagation Characteristics in CRLH Structures," Electrical Engineering Department, University of California, Los Angeles, CA 90095, 2004 IEEE.
A, Sanada et al., "Novel Zeroth-Order Resonance in Composite Right/Left-Handed Transmisison Line Resonators," Electrical Engineering Department, 2003 Asia-Pacific Microwave Conference.
EPO Communication dated Jul. 18, 2008.
Caloz C et al., "Composite right/left-handed transmision line metamateriais" IEEE Microwave Magazine, vol. 5, No. 3, Sep. 1, 2004, pp. 34-50, XP011119759 (D8).
Itoh T: "Invited paper: Prospects for metamaterials" Electronics Letters, vol. 40, No. 16, Aug. 5,2004, pp. 972-973, XP006022467 (D9).
Caloz C et al., "Invited — Novel microwave devices and structures based on the transmission line approach of meta-materials" 2003 IEEE MTT-S International Microwave Symposium Digest, vol. 1, Jun. 8, 2003, pp. 195-198, XP010644503 (D10).

(Continued)

*Primary Examiner*—Yuwen Pan
*Assistant Examiner*—Ankur Jain

(57) ABSTRACT

The present invention provides a filter unit cell. The filter unit cell includes a variable capacitor coupled in series between first and second nodes and an inductor coupled in series between the second node and a third node.

10 Claims, 5 Drawing Sheets

OTHER PUBLICATIONS

Caloz C et al., "Characteristics of the Composite Right/Left-Handed Transmission Lines" IEEE Microwave and Wireless Components Letters, vol. 14, No. 2, Feb. 1, 2004, pp. 68-70, XP11108069 (D11).

Sanada a. at al., "A planar zeroth-order resonator antenna using a left-handed transmission line" 34th European Microwave Conference, 2004, vol, 3, Oct. 11, 2004, pp. 1341-1344, XP10788350 (012).

Caloz C, Itoh T: "Lossy transmission line metamaterials" Microwve and Optical Technology Letters, vol. 43, No. 2, Oct. 20, 2004, pp. 112-114 (D13).

Eleftheriades G. et al., "Planar negative-refractive index media using a periodically L-C loaded transmission lines" IEEE Transactions on Microwave Theory and Techniques, vol. 50, No. 12, Dec. 2002, pp. 2702-2712, XP11076775 (D14).

* cited by examiner

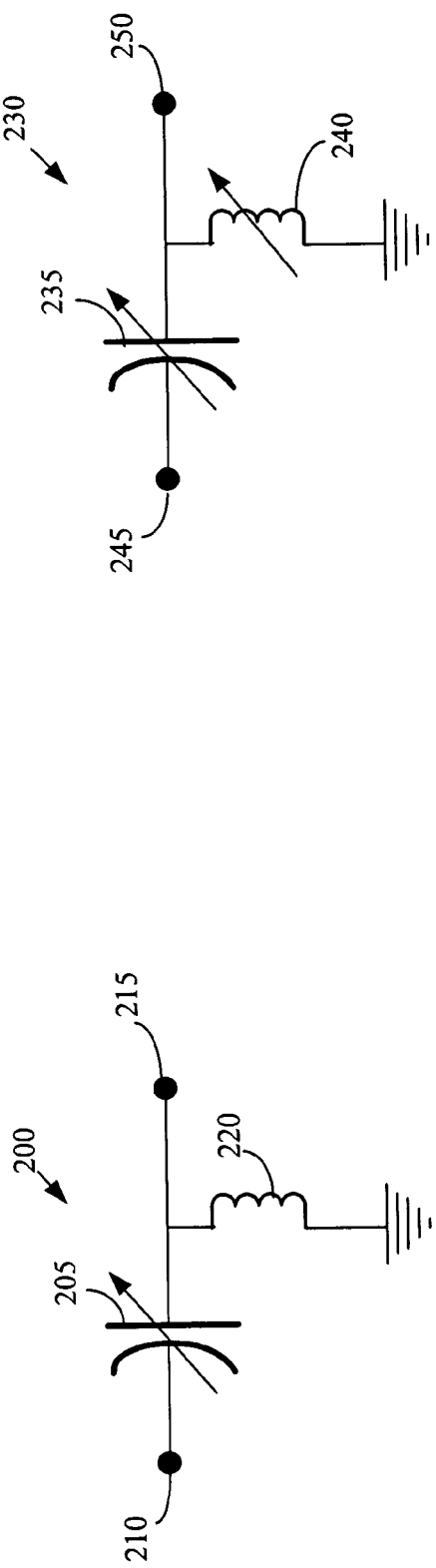
Figure 2A
Figure 2B
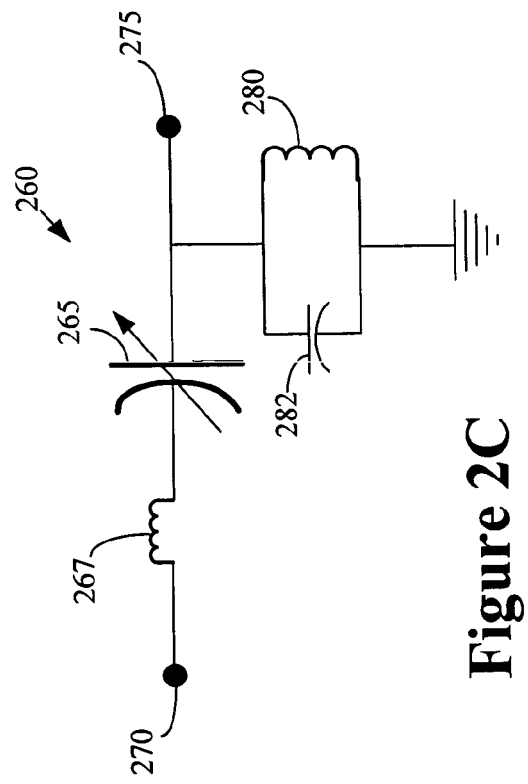
Figure 2C

US 7,593,696 B2

TUNABLE RADIO FREQUENCY FILTER

BACKGROUND OF THE INVENTION

1. Field of the Invention

This invention relates generally to telecommunication systems, and, more particularly, to wireless telecommunication systems.

2. Description of the Related Art

Wireless authentication systems typically include one or more base stations (sometimes referred to as node-Bs) and a plurality of mobile units. The mobile units may include cellular telephones or other user equipment, such as desktop personal computers, laptop computers, personal data assistants, pagers, and the like. The base stations and the mobile units may exchange voice and/or data information over an air interface. To transmit the voice and/or data information, the base station or mobile unit encodes the information according to one or more wireless telecommunication protocols such as Universal Mobile Telephone System (UMTS) protocol, a Global System for Mobile communications (GSM) protocol, a Code Division Multiple Access (CDMA, CDMA 2000) protocol, and the like. The encoded information is then used to modulate an electromagnetic wave, which is transmitted across the air interface. For example, the carrier electromagnetic wave may be a 1 GHz radio frequency carrier wave.

The modulated carrier wave transmitted by a mobile unit may be relatively weak when it is received at a base station. The modulated carrier wave may also be obscured by various sources of noise, including noise introduced by the mobile unit and environmental noise. Accordingly, one or more antennas at the base station are typically coupled to one or more filters, which are tuned to the frequency of the carrier wave. For example, a base station antenna may be coupled to a 1 GHz radio frequency filter to reduce various noise components and thereby improve the selectivity of the base station to 1 GHz radio frequency carrier waves transmitted by the mobile units associated with the base station.

The physical characteristics of conventional filters used in wireless telecommunication systems are determined by the wavelength of the carrier wave. For example, a 1 GHz radio frequency carrier wave has a wavelength of approximately 30 cm. Thus, the height of a quarter-wave resonator in a conventional duplex filter that is tuned to receive the 1 GHz carrier wave must be approximately 7.5 cm. Other wireless telecommunication systems may use lower frequencies, such as 450 MHz CDMA systems, which results in proportionately larger filters. At least in part to achieve a desired Q-factor, the duplex filter typically includes between 12 and 14 resonators. Thus, the form factor of a conventional duplex filter can be quite large. For example, the dimensions of a duplex filter tuned to 1 GHz may be 50 cm×7.5 cm×6 cm.

Conventional duplex filters are formed of metals that may expand and contract as the ambient temperature increases and decreases over time. The expansion and/or contraction of portions of the conventional duplex filter may detune the filter because the wavelength selected by the duplex filter is proportional to the physical dimensions of the filter. In order to maintain filter tuning during thermal deformation, conventional filters may be tuned over a small range of frequencies, typically approximately 5%. However, tuning the conventional filter results in power losses that may reduce the selectivity of the antenna and may also degrade the Q-factor of the filter. Filter losses may be about 0.5 dB and tuning elements can increase the losses to about 3.0 dB. Base station selectivity may thus be reduced by a similar amount, which may also reduce the radius of the cell served by the base station. Furthermore, conventional filters may only be used with a single carrier wave frequency because the power losses and/or degradation of the Q-factor typically prevent re-tuning the conventional filter to a different frequency band.

Conventional duplex filters are fabricated from relatively heavy materials, at least in part to reduce the deformation that may be caused by temperature changes and to reduce the corresponding detuning of the filter. For example, a conventional duplex filter may weigh as much as 10 kg. The large mass of the conventional duplex filter may substantially increase the mass of the duplex filters associated with each base station. For example, a base station that serves mobile units in three sectors may include two antennas for each sector. Each antenna requires at least one associated duplex filter, resulting in a total of at least six duplex filters, having a total weight of about 60 kg. Moreover, in Multiple Input Multiple Output (MIMO) systems, the total number of antennas, and therefore the total number of duplex filters, generally increases in proportion to the number of input and/or output channels of the MIMO system. For example, a typical MIMO antenna system uses four antennas per sector, which results in 12 duplex filters weighing approximately 120 kg.

Fabricating some components of conventional duplex filters from materials having a relatively high dielectric constant may reduce the dimensions of some filters. For example, ceramic materials have dielectric constant of $\epsilon$. If a portion of the filter is fashioned from a ceramic material, the height of the filter may be reduced by a factor of approximately $\sqrt{\epsilon}$. Thus, if a ceramic material has a dielectric constant of $\epsilon=4$, the height of the filter may be reduced by a factor of approximately 2. However, the physical dimensions of conventional filters fabricated from ceramic materials are still tied to the wavelength of the carrier wave. The mass of the conventional duplex filter may also be reduced by incorporating ceramic materials and reducing the physical dimensions of the conventional filter. However, the reductions in mass are modest because the physical dimensions of the conventional filter are still tied to the wavelength of the carrier wave.

The present invention is directed to addressing the effects of one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, a filter unit cell is provided. The filter unit cell includes a variable capacitor coupled in series between first and second nodes and an inductor coupled in series between the second node and a third node.

In another embodiment of the present invention, a bandpass filter is provided. The bandpass filter includes an input node, an output node, and a plurality of filter unit cells coupled in series between the input node and the output node. Each filter unit cell includes a variable capacitor coupled in series between first and second nodes and an inductor coupled in series between the second node and a third node.

In another embodiment of the present invention, a duplex filter is provided. The duplex filter includes at least one first filter unit cell coupled in series between a transmission node and an antenna node, and at least one second filter unit cell coupled in series between a reception node and the antenna node. Each of the first and second filter unit cells includes first, second, and third nodes, a variable capacitor coupled in series between the first and second nodes, and an inductor coupled in series between the second node and the third node.

In yet another embodiment of the present invention, a method of filtering is provided. The method includes determining at least one zero-order resonance frequency of at least one filter unit cell to be approximately equal to a first frequency and providing a signal having the first frequency to the at least one filter unit cell

BRIEF DESCRIPTION OF THE DRAWINGS

The invention may be understood by reference to the following description taken in conjunction with the accompanying drawings, in which like reference numerals identify like elements, and in which:

FIG. 2A conceptually illustrates a first exemplary embodiment of a filter unit cell having a variable capacitor, in accordance with the present invention;

FIG. 2B conceptually illustrates a second exemplary embodiment of a filter unit cell having a variable capacitor and a variable inductor, in accordance with the present invention;

FIG. 2C conceptually illustrates a third exemplary embodiment of a filter unit cell having a variable capacitor, in accordance with the present invention;

Figure 1:
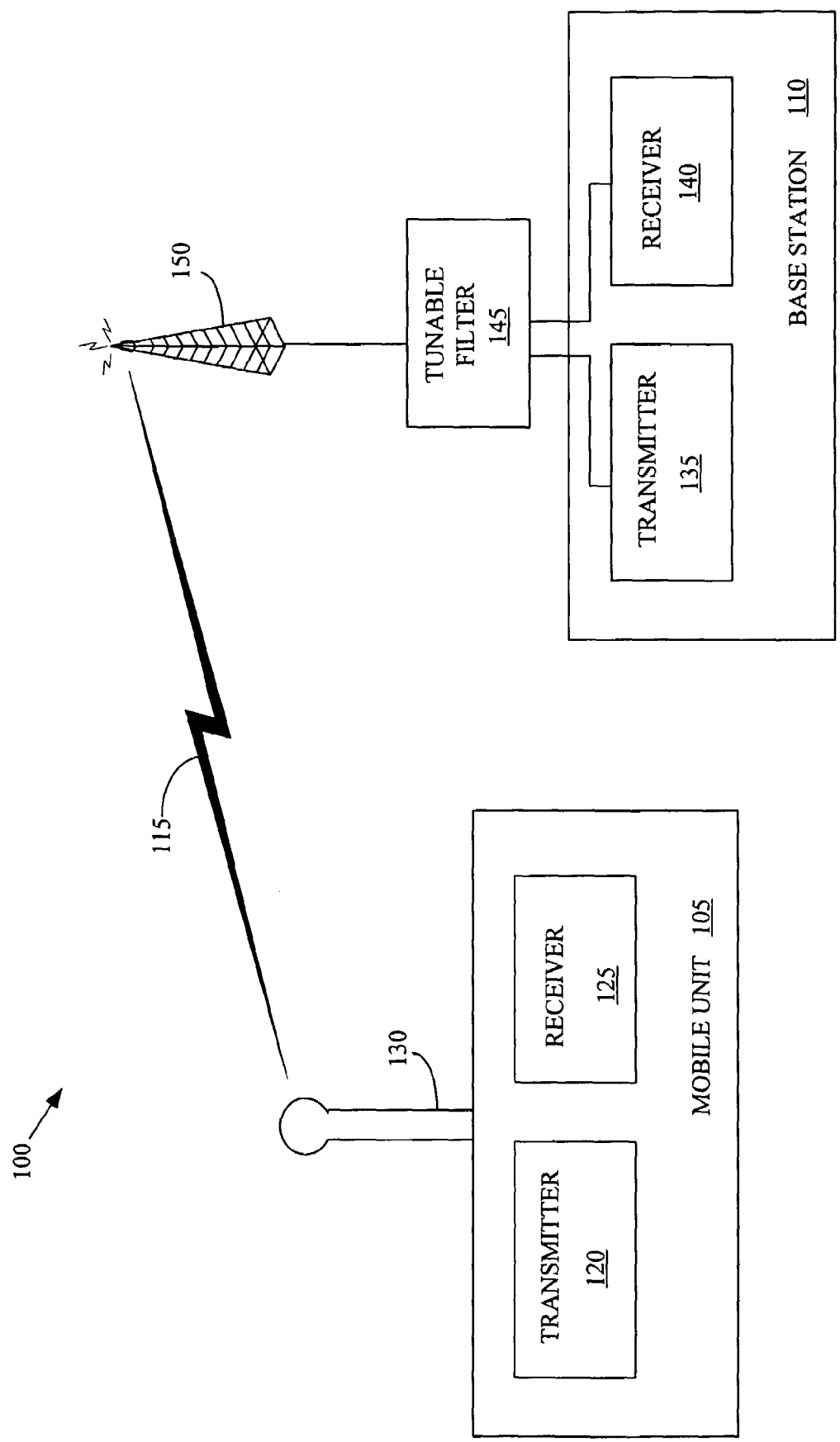
FIG. 1 conceptually illustrates a wireless telecommunication system, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to FIG. 1, an exemplary embodiment of a wireless telecommunication system 100 is conceptually illustrated. In the illustrated embodiment, a mobile unit 105 communicates with a base station 110 over an air interface 115. Although only a single mobile unit 105 and a single base station 110 are shown in FIG. 1, persons of ordinary skill in the art should appreciate that any desirable number of mobile units 105 and/or base stations 110 may be included in the wireless telecommunication system 100. In various alternative embodiments, the mobile unit 105 may include cellular telephones or other user equipment, such as desktop personal computers, laptop computers, personal data assistants, pagers, and the like. Persons of ordinary skill in the art having benefit of the present disclosure should also appreciate that the wireless telecommunication system 100 may, in one embodiment, be formed entirely from mobile units 105 using an ad hoc system.

The base station 110 and mobile unit 105 exchange information over the air interface 115 according to one or more wireless telecommunication protocols such as Universal Mobile Telephone System (UMTS) protocol, a Global System for Mobile communications (GSM) protocol, a Code Division Multiple Access (CDMA, CDMA 2000) protocol, and the like. However, persons of ordinary skill in the art should appreciate that the present invention is not limited to the aforementioned wireless telecommunication protocols. In alternative embodiments, any desirable wireless telecommunication protocol, or combination of protocols, may be used. For example, the mobile unit 105 and the base station 110 may communicate over the air interface 115 according to a Bluetooth protocol, an 802.11 protocol, and the like.

The mobile unit 105 includes a transmitter 120 and a receiver 125, which are both coupled to at least one antenna 130. The base station 110 also includes a transmitter 135 and a receiver 140. In the illustrated embodiment, the transmitter 135 and the receiver 140 are coupled to a tunable filter 145, which is coupled to a radio transmission tower 150. When a single radio transmission tower 150 is implemented, the tunable filter 145 may be a duplex filter. However, the present invention is not limited to base stations 110 that utilize a single radio transmission tower 150. In alternative embodiments, the transmitter 135 and the receiver 140 may each be coupled to a dedicated radio transmission tower 150, in which case the tunable filter 145 may be a bandpass filter. Persons of ordinary skill in the art having benefit of the present disclosure should also appreciate that the mobile unit 105 may include a tunable filter (not shown), which may be a duplex filter or a bandpass filter.

The transmitters 120, 135 can encode messages according to the appropriate protocol and provide these messages for transmission over the air interface 115. The receivers 125, 140 can receive encoded messages and decode these messages using the appropriate protocol. Techniques for encoding, decoding, transmitting, and/or receiving messages over the air interface 115 are known to persons of ordinary skill in the art and so only those aspects of wireless telecommunication over the air interface 115 that are relevant to the present invention will be discussed in detail herein.

In operation, encoded information provided by the transmitters 120, 135 is used to modulate an electromagnetic wave, which may also be referred to as a carrier electromagnetic wave, a radiofrequency carrier wave, a carrier wave, a carrier, and the like. In one embodiment, the carrier wave is a radiofrequency wave. For example, the carrier electromagnetic wave may be a 1 GHz radio frequency carrier wave. However, the carrier wave may be an electromagnetic wave of any desirable frequency. Other examples of carrier wave frequencies include a 450 MHz CDMA carrier wave, carrier waves having frequencies in the Industrial-Scientific-Medical (ISM) band, and the like. The modulated carrier wave is transmitted across the air interface 115. For example, the modulated carrier wave may be transmitted by the antenna 130 and received by the radio tower 150. For another example, the modulated carrier wave may be transmitted by the radio tower 150 and received by the antenna 130.

The tunable filter 145 includes a zero-order resonance filter, such as those based on metamaterial structures. Metamaterials are artificial structures or circuits that can be designed to exhibit specific electromagnetic properties not commonly found in nature. In the illustrated embodiment, the tunable filter 145 includes a zero-order resonance filter based upon a composite right/left-handed transmission line metamaterial, as will be discussed in detail below. In contrast to conventional filters, the physical dimensions of the tunable filter 145 are not strictly proportional to the resonance frequency and/or wavelength because zero-order resonance frequencies are not determined by the physical dimensions of the filter. Moreover, the Q-factor of the resonance is typically not degraded when losses increase, as will be discussed in detail below. The center frequency and/or bandwidth of the tunable filter 145 may therefore be tuned over a relatively large range of frequencies without suffering substantial decreases in selectivity and/or degradation in the Q-factor of the tunable filter 145. For example, the center frequency of the tunable filter 145 may be tuned over one or more octaves without suffering substantial decreases in filter selectivity and/or degradation in the Q-factor.

The tunable filter 145 is also less susceptible to thermal deformation because zero-order resonance frequencies are not determined by the physical dimensions of the tunable filter 145. Consequently, mechanical stability of the tunable filter 145 is less critical, at least in part because thermal deformation of the filter, e.g. expansion or shrinkage of the mechanical dimensions of the tunable filter 145 due to changing ambient temperatures, may not substantially change the resonance frequency of the tunable filter 145. Thus, the mass of the tunable filter 145 may be substantially decreased. For example, a lightweight plastic plated with a thin metal film may be used to shield the tunable filter 145. The form factor of the tunable filter 145 may also be reduced because zero-order resonance frequencies are not determined by the physical dimensions of the tunable filter 145.

FIG. 2A conceptually illustrates a first exemplary embodiment of a filter unit cell 200 having a variable capacitor 205. The variable capacitor 205 may also be referred to as a varactor, a capacitor having a variable capacitance, and the like. In the first exemplary embodiment of the filter unit cell 200, the variable capacitor 205 is connected in series between nodes 210, 215 and an inductor 220 is coupled as a shunt between the node 215 and a third node, which in the illustrated embodiment is coupled to ground. The idealized filter unit cell 200 shown in FIG. 2A is a left-handed metamaterial. However, energy conservation laws imply that the filter unit cell 200 formed from the variable capacitor 205 and the inductor 220 includes parasitic capacitances and inductances (not shown) that function as a right-handed metamaterial. Thus, in practice, the filter unit cell 200 formed from the variable capacitor 205 and the inductor 220 is a metamaterial that mimics a composite right/left-handed transmission line metamaterial. The filter unit cell 200 therefore has a zero-order resonance frequency that may be tuned by varying the capacitance of the variable capacitor 205. For example, the zero-order resonance frequency of the filter unit cell 200 may be tuned over one or more octaves. Relationships between the capacitances, inductances, and resonant frequencies that may be used to tune the zero-order resonance frequency of the filter unit cell 200 are known in the art.

In operation, the voltage at nodes 210, 215 is substantially the same, so the voltage drop across the variable capacitor 205 is substantially equal to zero. Consequently, any resistance that may be present in, or any resistance that may be added to, the filter unit cell 200 will not draw current or dissipate heat.

The Q-factor of the filter unit cell 200 is therefore substantially independent of the capacitance of the lossy variable capacitor 205. Varying the capacitance of the variable capacitor 205 may therefore be used to vary the zero-order resonance frequency of the filter unit cell 200 without introducing additional losses, degrading selectivity of the filter unit cell 200, and/or reducing the Q-factor of the filter unit cell 200.

FIG. 2B conceptually illustrates a second exemplary embodiment of a filter unit cell 230 having a variable capacitor 235 and a variable inductor 240. The variable inductor 235 may also be referred to as a variometer, an inductor having a variable inductance, and the like. In the second exemplary embodiment of the filter unit cell 230, the variable capacitor 235 is connected in series between nodes 245, 250 and the variable inductor 240 is coupled as a shunt between the node 250 and a third node, which in the illustrated embodiment is coupled to ground. The filter unit cell 230 includes parasitic capacitances and inductances, as discussed above, so that the filter unit cell 230 is a metamaterial that mimics a composite right/left-handed transmission line metamaterial. The filter unit cell 230 therefore has a zero-order resonance frequency that may be tuned by varying the capacitance of the variable capacitor 235 and/or the inductance of the variable inductor 240. For example, the zero-order resonance frequency of the filter unit cell 200 may be tuned over one or more octaves.

In operation, the voltage at nodes 245, 250 is substantially the same, so the voltage drop across the variable capacitor 235 is substantially equal to zero. Consequently, any resistance that may be present in, or any resistance that may be added to, the filter unit cell 230 will not draw current or dissipate heat. The Q-factor of the filter unit cell 230 is therefore substantially independent of the capacitance of the lossy variable capacitor 235. Varying the capacitance of the variable capacitor 235 may therefore be used to vary the zero-order resonance frequency of the filter unit cell 230 without introducing additional losses, degrading selectivity of the filter unit cell 230, and/or reducing the Q-factor of the filter unit cell 230. Varying the inductance of the variable inductor 240 may extend the tuning range of the zero-order resonance frequency and/or alter the characteristic impedance of the filter unit cell 230. However, in some embodiments, varying the inductance of the variable inductor 240 may increase losses in the filter unit cell 230 and therefore decrease the Q-factor of the filter unit cell 230.

FIG. 2C conceptually illustrates a third exemplary embodiment of a filter unit cell 260 having a variable capacitor 265. In the third exemplary embodiment of the filter unit cell 260, the variable capacitor 265 and an inductor 267 are connected in series between nodes 270, 275. An inductor 280 and a capacitor 282 are coupled (in parallel) as a shunt between the node 275 and a third node, which in the third embodiment is coupled to ground. Although the inductor 280 is not shown as variable in FIG. 2C, persons of ordinary skill in the art having benefit of the present disclosure should appreciate that alternative embodiments may include a variable inductor 280.

The filter unit cell 260 shown in FIG. 2C is a composite right/left-handed transmission line metamaterial, at least in part because the filter unit cell 260 includes the inductor 267 and the capacitor 282. In one embodiment, the inductor 267 and the capacitor 282 represent parasitic capacitances, such as may be present in FIGS. 2A and 2B. Alternatively, the inductor 267 and the capacitor 282 may represent elements that are built into the filter unit cell 260. The filter unit cell 260 may also include parasitic capacitances and inductances not shown in FIG. 2C. The filter unit cell 260 therefore has a zero-order resonance frequency that may be tuned by varying the capacitance of the lossy variable capacitor 265. For example, the zero-order resonance frequency of the filter unit cell 260 may be tuned over one or more octaves. In embodiments that include a variable inductor 280, the zero-order resonance frequency of the filter unit cell 260 may also be tuned by varying the variable inductor 280.

In operation, the voltage at nodes 270, 275 is substantially the same, so the voltage drop 5 across the variable capacitor 265 is substantially equal to zero. Consequently, any resistance that may be present in, or any resistance that may be added to, the filter unit cell 260 will not draw current or dissipate heat. The Q-factor of the filter unit cell 260 is therefore substantially independent of the capacitance of the variable capacitor 265. Varying the capacitance of the variable capacitor 265 may therefore be used to vary the zero-order resonance frequency of the filter unit cell 260 without introducing additional losses, degrading selectivity of the filter unit cell 260, and/or reducing the Q-factor of the filter unit cell 260.

Persons of ordinary skill in the art should appreciate that the term "substantially" as used above is intended to indicate that, in practice, the filter unit cells 200, 230 may not operate precisely as indicated in the above idealized examples. For example, varying the capacitance of the variable capacitors 210, 235 may slightly change the Q-factor of the filter unit cells 200, 230. However, the change in the Q-factor of the filter unit cells 200, 230 would still be significantly less than the corresponding change in the Q-factor introduced by varying parameters to tune a conventional filter unit cell over a corresponding range of center frequencies.

Figure 3:
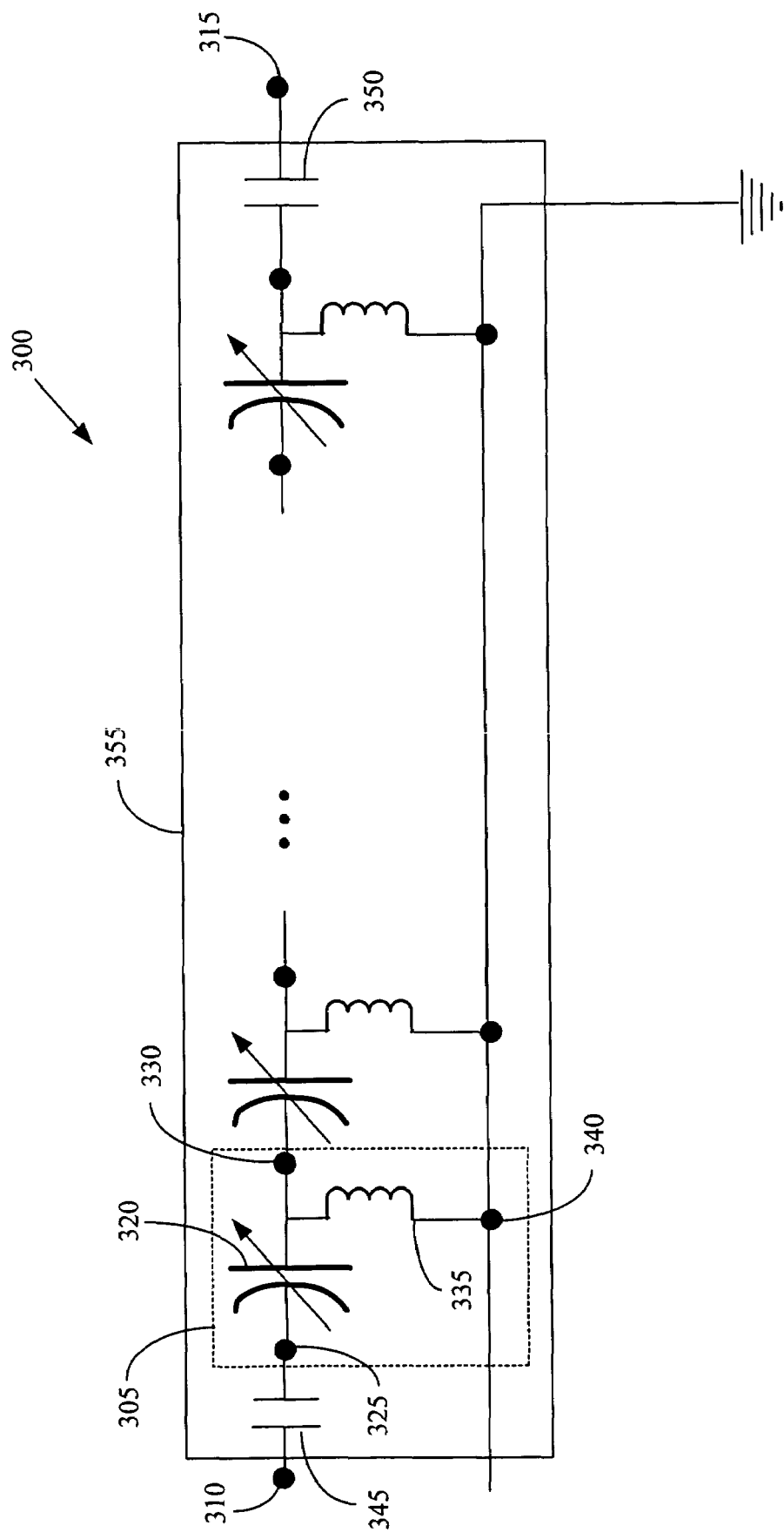
FIG. 3 conceptually illustrates one embodiment of a tunable bandpass filter, in accordance with the present invention.

FIG. 3 conceptually illustrates one embodiment of a tunable bandpass filter 300. In the illustrated embodiment, the tunable bandpass filter 300 includes a plurality of filter unit cells 305 (only one indicated in FIG. 3) coupled in series between an input node 310 and an output node 315. Each filter unit cell 305 includes a variable capacitor 320 coupled in series between nodes 325, 330 and a shunt inductor 335 coupled between the node 330 and a node 340. In various alternative embodiments, the shunt inductor 335 may have a fixed inductance or may have a variable inductance. The tunable bandpass filter 300 may also include one or more coupling capacitors 345, 350 coupled between the input node 310 and/or output node 315 and nodes 325, 330 of the filter unit cells 305. For example, the coupling capacitors 345, 350 may be provided for impedance matching between the bandpass filter 300 and other devices that may be coupled to the input or output nodes 310, 315.

In operation, the capacitance of one or more of the variable capacitors 320 may be varied to tune a zero-order resonance frequency of the tunable bandpass filter 300. If the shunt inductor 335 is variable, the inductance of the shunt inductor 335 may also be varied to tune the zero-order resonance frequency. As discussed above, the voltage at nodes 325, 330 is substantially the same, so voltage drops across the variable capacitors 320 are substantially equal to zero. Consequently, varying the capacitance of the variable capacitors 320 may be used to vary the zero-order resonance frequency of the tunable bandpass filter 300 without introducing additional losses, degrading the selectivity of the tunable bandpass filter 300, and/or reducing the Q-factor of the tunable bandpass filter 300.

In the illustrated embodiment, the tunable bandpass filter 300 is at least partially enclosed in a shielding element 355. At least in part because the zero-order resonance frequency of the tunable bandpass filter 300 is not determined by the physical dimensions of the tunable bandpass filter 300, the shielding element 355 may be formed of relatively lightweight material. For example, the shielding element 355 may be formed of a lightweight plastic plated with a thin metal film. The form factor of the shielding element 355 may also be reduced relative to shielding elements for conventional filters.

Figure 4:
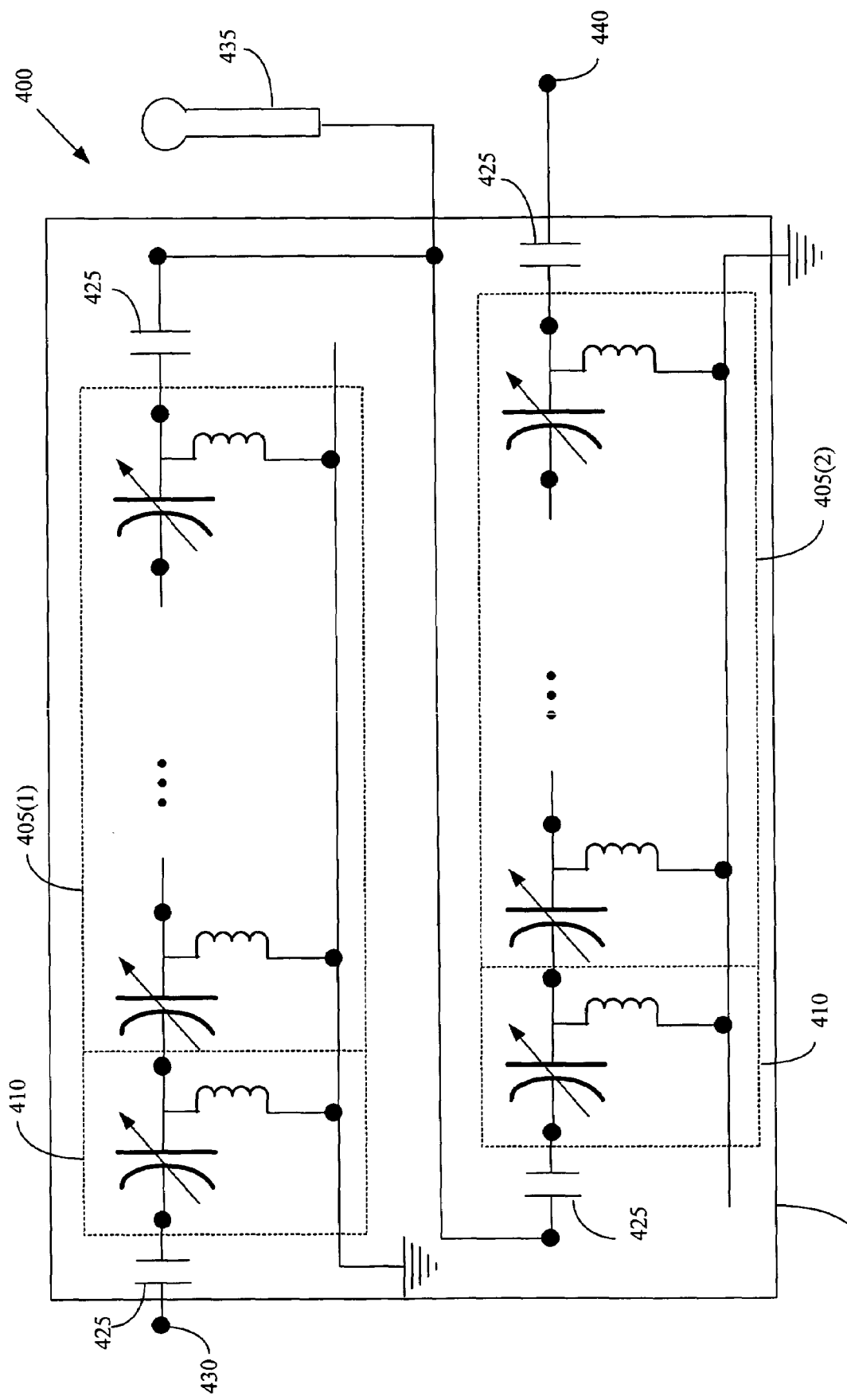
FIG. 4 conceptually illustrates one embodiment of a tunable duplex filter, in accordance with the present invention.

FIG. 4 conceptually illustrates one embodiment of a tunable duplex filter 400. In the illustrated embodiment, the tunable duplex filter 400 includes a pair of tunable bandpass filters 405(1-2). As discussed above, each tunable bandpass filter includes a plurality of filter unit cells 410 coupled in series. The tunable bandpass filters 405(1-2) may also include one or more coupling capacitors 425. For example, the coupling capacitors 425 may be provided for impedance matching between the tunable bandpass filters 405(1-2) and other devices that may be coupled to the tunable bandpass filters 405(1-2). The tunable bandpass filter 405(1) is coupled in series between a reception node 430 and an antenna 435. The tunable bandpass filter 405(2) is coupled in series between a transmission node 440 and the antenna 435.

In operation, the zero-order resonance frequency of the duplex filter 400 may be varied by varying one or more capacitances and/or inductances. Consequently, signals that can be transmitted and/or received by the antenna 435 may be filtered at a selected zero order resonance frequency using the tunable bandpass filters 405(1-2). Although the tunable bandpass filters 405(1-2) are tuned to approximately the same zero-order resonance frequency in the illustrated embodiment, the present invention is not so limited. In alternative embodiments, the zero-order resonance frequencies of the tunable bandpass filters 405(1-2) may be tuned independently to any desirable center frequency. For example, a typical duplex shift between the reception and transmission frequencies is about 10-100 MHz. The tunable duplex filter 400 may also be enclosed in a shielding element 450. At least in part because the zero-order resonance frequency of the tunable duplex filter 400 is not determined by the physical dimensions of the tunable duplex filter 400, the shielding element 450 may be formed of relatively lightweight material. For example, the shielding element 450 may be formed of a lightweight plastic plated with a thin metal film. The form factor of the shielding element 450 may also be reduced relative to shielding elements for conventional filters.

Figure 5:
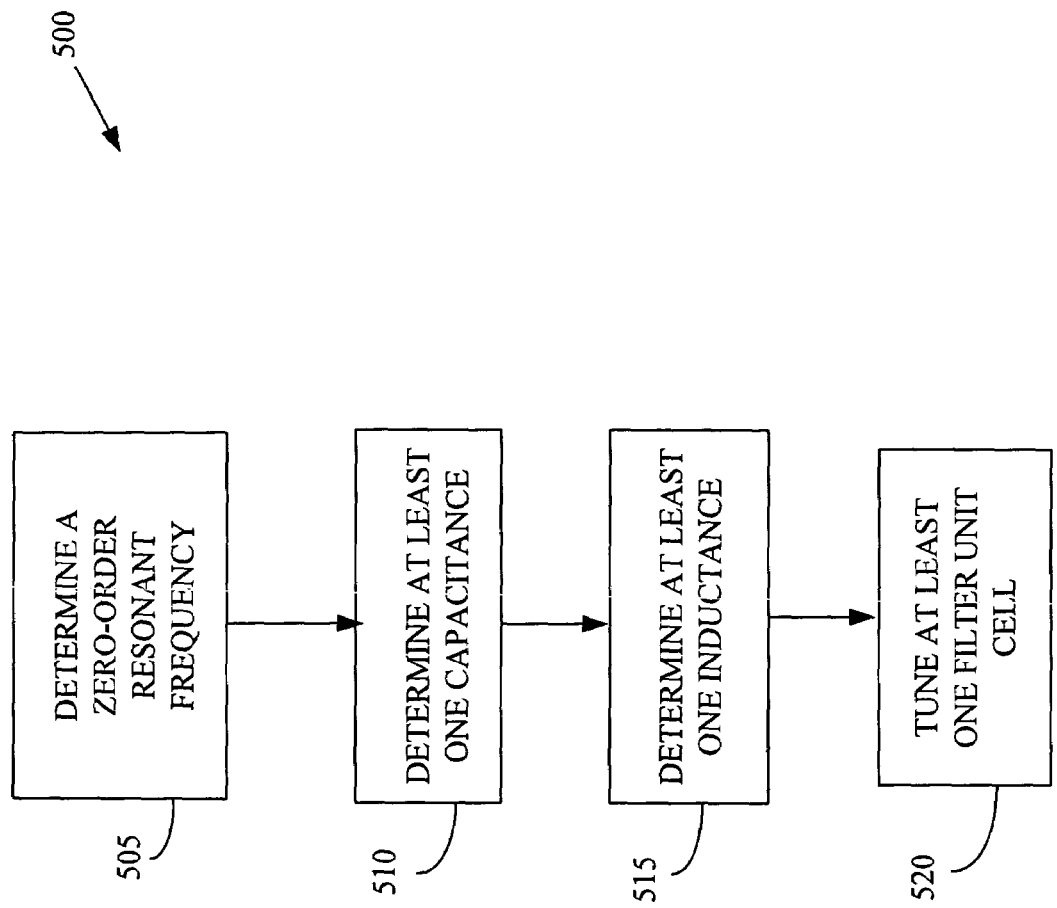
FIG. 5 conceptually illustrates one embodiment of a method of tuning at least one zero-order resonance frequency of at least one filter unit cell, in accordance with the present invention.

FIG. 5 conceptually illustrates one embodiment of a method 500 of tuning a zero-order resonance frequency of at least one filter unit cell. In various alternative embodiments, the tunable filter unit cell may be a portion of any desirable filter, such as the filter unit cell 100 shown in FIG. 1, the filter unit cells 305 in the tunable bandpass filter 300 shown in FIG. 3, and the filter unit cells 405 in the tunable duplex filter 400 shown in FIG. 4. In the illustrated embodiment, the zero-order resonance frequency is determined (at 505). For example, a desired zero-order resonance frequency may be determined based upon a frequency of a carrier wave. At least one capacitance is determined (at 510) based upon the determined zero-order resonance frequency. In one embodiment, at least one inductance is also determined (at 515). For example, when the embodiment of the filter unit cell includes a variable inductor, the inductance of the variable inductor may be determined (at 515) based upon the determined zero-order resonance frequency. The at least one unit filter cell is then tuned (at 520) based upon the determined zero-order resonance frequency. For example, a capacitance of a variable capacitor in the filter unit cell may be varied so that a zero-order resonance frequency of the filter unit cell is approximately equal to the determined zero-order resonance frequency. The inductance of the variable inductor, if present, may also be varied so that the zero-order resonance frequency of the filter unit cell is approximately equal to the determined zero-order resonance frequency.

One or more embodiments of the tunable zero-order resonance frequency filters described above may have a number of advantages over conventional filters. Since the tunable zero-order resonance frequency filters may be tuned over a surprisingly large range of frequencies without suffering the expected degradation of selectivity and and/or degradation of the Q-factor, a common filter may be able to serve a variety of different filter shapes and carrier wave of frequencies, which may help avoid a huge spread of filter variants, each of which would need to be manufactured separately. Reducing the spread of filter variants may lead to large logistical savings in the supply chain for the filters. Furthermore, the tunable zero-order resonance frequency filters may be remotely tunable which may allow reconfiguration of a base station implementing the tunable zero-order resonance frequency filters to be reconfigured remotely, thereby avoiding costly and time-consuming site visits. As discussed in detail above, tunable zero-order resonance frequency filters may also have a smaller form factor and be deployed in lightweight housings, thereby dramatically reducing the size and mass of the filters.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   setting at least one zero-order resonance frequency of at least one filter unit cell to be approximately equal to a first frequency by tuning said at least one zero-order resonance frequency over a plurality of octaves without suffering substantial decreases in at least one of a selectivity of the filter unit cell or a degradation in the Q-factor of the filter unit cell, said at least one filter unit cell comprising a metamaterial formed of a variable capacitor coupled in series between first and second nodes and an inductor coupled in series between the second node and a third node, and wherein said at least one zero-order resonance frequency is set by varying a capacitance of the variable capacitor; and
   providing a signal having the first frequency to the at least one filter unit cell.

2. The method of claim 1, wherein selling said at least one zero-order resonance frequency comprises determining at least one capacitance of a variable capacitor in the at least one filter unit cell based on the zero-order resonance frequency, and wherein a Q-factor of said at least one filter unit cell is substantially independent of said at least one capacitance of the variable capacitor.

3. The method of claim 2, wherein determining the at least one capacitance of a variable capacitor in the at least one filter unit cell comprises determining a plurality of capacitances in a plurality of filter unit cells coupled in series.

4. The method of claim 3, determining the plurality of capacitances in the plurality of filter unit cells coupled in series comprises determining a plurality of capacitances in at least one of a bandpass filter and a duplex filter.

5. The method of claim 4, wherein setting said at least one zero-order resonance frequency comprises determining at least one inductance of a variable inductor in the at least one filter unit cell based on the zero-order resonance frequency.

6. The method of claim 5, wherein determining at least one inductance of a variable inductor in the at least one filter unit cell comprises determining a plurality of inductances in a plurality of filter unit cells coupled in series.

7. The method of claim 6, determining the plurality of inductances in the plurality of filter unit cells coupled in series comprises determining a plurality of inductances in at least one of a bandpass filter and a duplex filter.

8. The method of claim 1, wherein setting said at least one zero-order resonance frequency comprises tuning said at least one zero-order resonance frequency over a plurality of octaves by varying at least one of a variable capacitance or a variable inductance of the filter unit cell.

9. The method of claim 8, wherein said at least one zero-order resonance frequency is substantially independent of the physical dimensions of said at least one filter unit cell.

10. A method, comprising:
setting at least one zero-order resonance frequency of at least one filter unit cell to be approximately equal to a first frequency, said at least one filter unit cell comprising a metamaterial formed of a variable capacitor coupled in series between first and second nodes and an inductor coupled in series between the second node and a third node, and wherein said at least one zero-order resonance frequency is set by varying a capacitance of the variable capacitor, and wherein said at least one zero-order resonance frequency is substantially independent of the physical dimensions of said at least one filter unit cell, and further wherein setting said at least one zero-order resonance frequency comprises tuning said at least one zero-order resonance frequency over a plurality of octaves without suffering substantial decreases in at least one of a selectivity of the filter unit cell or a degradation in the Q-factor of the filter unit cell; and providing a signal having the first frequency to the at least one filter unit cell.

* * * * *

UNITED STATES PATENT AND TRADEMARK OFFICE
CERTIFICATE OF CORRECTION

PATENT NO.        : 7,593,696 B2                     Page 1 of 1
APPLICATION NO.   : 11/055137
DATED             : September 22, 2009
INVENTOR(S)       : Georg Fischer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 759 days.

Signed and Sealed this

Twenty-eighth Day of September, 2010

David J. Kappos
*Director of the United States Patent and Trademark Office*